(12) United States Patent
Ishikawa (10) Patent No.: US 7,658,799 B2
(45) Date of Patent: Feb. 9, 2010

(54) PLASMA FILM-FORMING APPARATUS AND PLASMA FILM-FORMING METHOD

(75) Inventor: Hiraku Ishikawa, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 63 days.

(21) Appl. No.: 10/579,777

(22) PCT Filed: Nov. 18, 2004

(86) PCT No.: PCT/JP2004/017162

§ 371 (c)(1), (2), (4) Date: Feb. 26, 2008

(87) PCT Pub. No.: WO2005/050723

PCT Pub. Date: Jun. 2, 2005

(65) Prior Publication Data

US 2008/0213504 A1    Sep. 4, 2008

(30) Foreign Application Priority Data

Nov. 19, 2003    (JP) .............................. 2003-389469

(51) Int. Cl.
*C23C 16/00* (2006.01)
(52) U.S. Cl. ............. 118/715; 118/723 R; 118/723 ER; 427/248.1; 427/569
(58) Field of Classification Search ................. 118/715, 118/723 R, 723 ER
See application file for complete search history.

(56) References Cited

U.S. PATENT DOCUMENTS 4,859,277 A    8/1989   Barna et al.
5,819,684 A *  10/1998  Hawkins et al. ............. 118/715
6,028,014 A    2/2000   Sukjarev (Continued)

FOREIGN PATENT DOCUMENTS

JP    2-16733 A    1/1990

(Continued)

OTHER PUBLICATIONS

International Search Report dated Mar. 8, 2005 including English Translation (Two (2) pages).

(Continued)

*Primary Examiner*—Shamim Ahmed
(74) *Attorney, Agent, or Firm*—Crowell & Moring LLP (57) ABSTRACT

The present invention ensures a uniform concentration of a plasma excitation gas supplied to a plasma generation region while preventing the plasma excitation gas from turning into plasma before supply. In a plasma film forming apparatus for forming a film on a substrate using plasma, a flat-plate structure partitioning the inside of a processing container into two, upper and lower, regions is disposed between a high frequency wave supply unit and a substrate mounting unit in the processing container. The plasma excitation gas is supplied into the processing container from the lower side toward the region on the high frequency wave supply unit side, and the structure is formed with a source gas supply port for supplying a source gas for film formation in the region on the mounting unit side and an opening for allowing plasma generated in the region on the high frequency wave supply unit side to pass to the region on the mounting unit side.

13 Claims, 10 Drawing Sheets

U.S. PATENT DOCUMENTS

| | | | |
|---|---|---|---|
| 6,152,071 A | * 11/2000 | Akiyama et al. | 118/723 VE |
| 6,663,715 B1 | * 12/2003 | Yuda et al. | 118/723 R |
| 2001/0003014 A1 | 6/2001 | Yuda | |
| 2002/0158714 A1 | * 10/2002 | Kaitila et al. | 333/188 |

FOREIGN PATENT DOCUMENTS

| | | |
|---|---|---|
| JP | 10-22279 A | 1/1998 |
| JP | 11-233502 A | 8/1999 |
| JP | 2001-164371 A | 6/2001 |

OTHER PUBLICATIONS

Japanese Office Action dated Jul. 14, 2009 w/English translation (five (5) pages).

Corresponding Forms PCT/IB/338, PCT/IB/373, and PCT/ISA/237 (Five (5) pages).

* cited by examiner

PLASMA FILM-FORMING APPARATUS AND PLASMA FILM-FORMING METHOD

TECHNICAL FIELD

The present invention relates to a plasma film forming apparatus and a plasma film forming method each for forming a film on a substrate.

BACKGROUND ART

In a manufacturing process of a semiconductor device and a liquid crystal display device, for example, film forming processing is performed for forming a conductive film and an insulating film on the surface of a substrate. For the film forming processing, for example, plasma film forming processing is used for forming a film on the substrate using plasma.

The above plasma film forming processing is generally performed in a plasma film forming apparatus, for which a plasma film forming apparatus has been conventionally employed which generates plasma through use of a microwave electric field to form a film. With the plasma film forming apparatus using a microwave, the film forming processing on the substrate can be efficiently performed in a short time through use of high density plasma.

The above-described plasma film forming apparatus usually includes a mounting table for mounting the substrate thereon at a bottom portion in a processing container and a radial line slot antenna for supplying a microwave into the processing container at a ceiling portion of the processing container. When performing film forming processing on the substrate, a plasma excitation gas in the processing container is made plasma by the microwave supplied from the radial line slot antenna at the ceiling portion into the processing container, and charged particles in the plasma dissociate, for example, a source gas in the processing container so that the radicals generated by the dissociation are used to deposit a predetermined film on the substrate.

Incidentally, in recent years, a plasma film forming apparatus using a microwave has been proposed in which a structure in a lattice form is provided between the radial line slot antenna and the mounting table for dividing the inside of the processing container into a plasma generation region on the upper side and a source gas dissociation region on the lower side (see, for example, Patent Document 1). In the plasma film forming apparatus, a supply port for supplying a plasma excitation gas to the plasma generation region is provided at the same ceiling portion of the processing container where the radial line slot antenna is provided. A path leading to the supply port of the plasma excitation gas passes under the radial line slot antenna. A supply port for supplying the source gas to the source gas dissociation region is provided on the lower surface of the structure. At the time of film forming, the microwave supplied from the ceiling portion of the processing container into the plasma generation region causes the plasma excitation gas, which is similarly supplied from the ceiling portion into the plasma generation region, to turn into plasma. The charged particles in the plasma pass through the structure in a lattice form to dissociate the source gas in the source gas dissociation region so that a film is formed on the substrate. In the plasma film forming apparatus, since the plasma generation region and the source gas dissociation region are separated, it is possible to prevent the dissociated radicals from adhering to the radial line slot antenna at the upper portion of the processing container to attenuate the microwave, and to prevent a large quantity of charged particles in the plasma from directly colliding against the substrate to break the substrate and the film on the substrate.

However, in the above-described plasma film forming apparatus, since the supply port of the plasma excitation gas and the path of the plasma excitation gas leading to the supply port are arranged directly below the radial line slot antenna, the microwave is applied to the plasma excitation gas in the supply port and in the path before supply, whereby a part of the plasma excitation gas turns into plasma. For this reason, charged particles with high energy may collide against the inside of the path of the plasma excitation gas and the inner wall near the supply port to break the inner wall. Accordingly, in the above-described plasma film forming apparatus, there is a need to frequently perform maintenance and change of parts, bringing about a decrease in apparatus availability and an increase in cost. Further, as a result of the plasma excitation gas turning into plasma in the path and so on, the amount of the plasma excitation gas supplied to the plasma generation region becomes insufficient, so that plasma may not be appropriately generated in the plasma generation region to affect the film formation on the substrate.

[Patent Document]
Japanese Patent Application Laid-open No. 2002-399330

DISCLOSURE OF THE INVENTION

Problems to Be Solved by the Invention

The present invention has been developed in consideration of the above viewpoints and its object is to provide a plasma film forming apparatus and a plasma film forming method each for preventing a plasma excitation gas from turning into plasma before supplied into a processing container to appropriately generate plasma in a region on a high frequency wave supply unit side being a plasma generation region.

Means for Solving the Problems

To attain the above object, the present invention is a plasma film forming apparatus for forming a film on a substrate using plasma including: a processing container for processing the substrate accommodated therein; a mounting unit for mounting the substrate thereon in the processing container; a high frequency wave supply unit for supplying a high frequency wave for plasma generation into the processing container; a flat-plate structure provided between the high frequency wave supply unit and the mounting unit and partitioning an inside of the processing container into a region on the high frequency wave supply unit side and a region on the mounting unit side; and a plasma excitation gas supply port for supplying a plasma excitation gas from a lower side toward the region on the high frequency wave supply unit side. The structure is formed with a source gas supply port for supplying a source gas for film formation into the region on the mounting unit side and an opening for allowing plasma generated in the region on the high frequency wave supply unit side to pass to the region on the mounting unit side.

According to the present invention, the plasma excitation gas can be supplied from the lower side toward the region on the high frequency wave supply unit side where plasma is generated in the processing container. This configuration can prevent the plasma excitation gas before supplied into the processing container from turning into plasma due to the high frequency wave from above from the high frequency wave supply unit. As a result, it is possible to prevent charged particles from breaking the portion near the plasma excitation gas supply port and the inside of the supply path leading thereto. Further, a sufficient amount of plasma excitation gas can be supplied to the region on the high frequency wave supply unit side, so that a film is appropriately formed on the substrate on the mounting unit.

A plurality of the plasma excitation gas supply ports may be formed, and the plasma excitation gas supply ports may be arranged to be able to uniformly supply the plasma excitation gas to the region on the high frequency wave supply unit side. If the plasma excitation gas is nonuniformly supplied to the region on the high frequency wave supply unit side, the plasma excitation gas concentrations become nonuniform, resulting in an uneven distribution of generated plasma. The uneven distribution of plasma in the region on the high frequency wave supply unit side makes the concentrations of radicals which are dissociated by the plasma passing through the structure also nonuniform in the region on the mounting unit side. As a result, the film forming speed varies within the substrate on the mounting table, resulting in a nonuniform film formation within the substrate. According to the present invention, the plasma excitation gas can be uniformly supplied to the region on the high frequency wave supply unit side, so that the film formation on the substrate can be performed uniformly within the substrate. Note that the "plasma excitation gas" herein refers to a gas used for generating plasma.

The above plasma film forming apparatus may further include another plasma excitation gas supply port for supplying the plasma excitation gas from a lateral side to the region on the high frequency wave supply unit side. In this case, since the plasma excitation gas can be supplied also from the lateral side to the region on the high frequency wave supply unit side, for example, the supply flow rate of the plasma excitation gas from the lateral side and the supply flow rate of the plasma excitation gas from the lower side can be adjusted to make the concentrations of the plasma excitation gas uniform in the region on the high frequency wave supply unit side. As a result, plasma is uniformly generated in the region on the high frequency supply unit side, and the plasma uniformly generates radicals of the source gas in the region on the mounting unit side. The radicals can form a film on the substrate uniform within the substrate.

The plasma excitation gas supply port may be formed at a central portion of the region on the high frequency wave supply unit side in a plan view. In this case, the plasma excitation gas can be sufficiently supplied also to the central portion of the region on the high frequency wave supply unit side where the gas from the lateral side from the other plasma excitation gas supply port hardly reaches, thereby ensuring a uniform concentration of the plasma excitation gas. Note that the "central portion of the region on the high frequency wave supply unit side" includes not only the central portion of the region on the high frequency wave supply unit side but also a region near the central portion within a predetermined distance from the central portion.

The plasma excitation gas supply port may be formed upward from the lower side of the region on the high frequency wave supply unit side. Further, an upper surface of the structure may have a plasma excitation gas supply pipe through which the plasma excitation gas passes arranged along the upper surface of the structure, and the plasma excitation gas supply port may be formed in the plasma excitation gas supply pipe. In this case, the plasma excitation gas can be supplied from the plasma excitation gas supply pipe arranged on the upper surface of the structure toward the region on the high frequency wave supply unit side. Furthermore, the plasma excitation gas supply pipe may be arranged in a lattice form in a plan view on the upper surface of the structure.

The structure may have a gas supply pipe leading to a supply source of the source gas arranged in a lattice form in a plan view, a plurality of the source gas supply ports may be formed in the gas supply pipe, the gas supply pipe may also lead to a supply source of the plasma excitation gas, and the source gas supply port may have a function as the plasma excitation gas supply port. In this case, the supply system of the plasma excitation gas supplied from the plasma excitation gas supply port and the supply system of the source gas are used in a combined manner, so that the supply systems of the gasses can be simplified.

The plasma film forming apparatus may further include a sensor for detecting a concentration distribution of the plasma excitation gas in the region on the high frequency wave supply unit side. In this case, the supply flow rate from the plasma excitation gas supply port can be adjusted based on the detection result by the sensor so that the concentrations of the plasma excitation gas are uniform in the region on the high frequency wave supply unit side. Accordingly, the plasma excitation gas concentrations in the region on the high frequency wave supply unit side can be made uniform more accurately and rapidly.

The present invention is a plasma film forming method using a plasma film forming apparatus including a processing container for processing the substrate accommodated therein; a mounting unit for mounting the substrate thereon in the processing container; and a high frequency wave supply unit provided at a position opposed to the substrate mounted on the mounting unit, for supplying a high frequency wave for plasma generation into the processing container, in which a plasma generation region is formed between the mounting unit and the high frequency wave supply unit where plasma is generated from a plasma excitation gas, the method characterized by including the steps of: supplying the plasma excitation gas from a lateral side and a lower side to the plasma generation region, and adjusting each of supply flow rates of the plasma excitation gas from the lateral side and from the lower side to conduct a control so that concentrations of the plasma excitation gas are uniform in the plasma generation region.

In this case, since the plasma excitation gas is supplied from the lateral side and the lower side to the region on the high frequency supply unit side, the plasma excitation gas before supplied never turns into plasma due to a high frequency wave from above, so that a sufficient amount of plasma excitation gas can be supplied to the plasma generation region. Further, since the supply flow rate of the plasma excitation gas from the lateral side and the supply flow rate of the plasma excitation gas from the lower side can be adjusted to make the concentrations of the plasma excitation gas uniform in the plasma generation region, plasma can then be generated in the plasma generation region without unevenness to form a film on the substrate on the mounting unit opposed to the plasma generation region uniform within the substrate.

EFFECT OF THE INVENTION

According to the present invention, film formation within a substrate can be performed uniformly and appropriately.

EXPLANATION OF CODES 1 plasma film forming apparatus
2 processing container
3 mounting table
12 radial line slot antenna
30 source gas supply structure
40 first plasma excitation gas supply port
50 plasma excitation gas supply structure
53 second plasma excitation gas supply port
R1 plasma generation region
R2 source gas dissociation region
W substrate

BEST MODE FOR CARRYING OUT THE INVENTION

Figure 1:
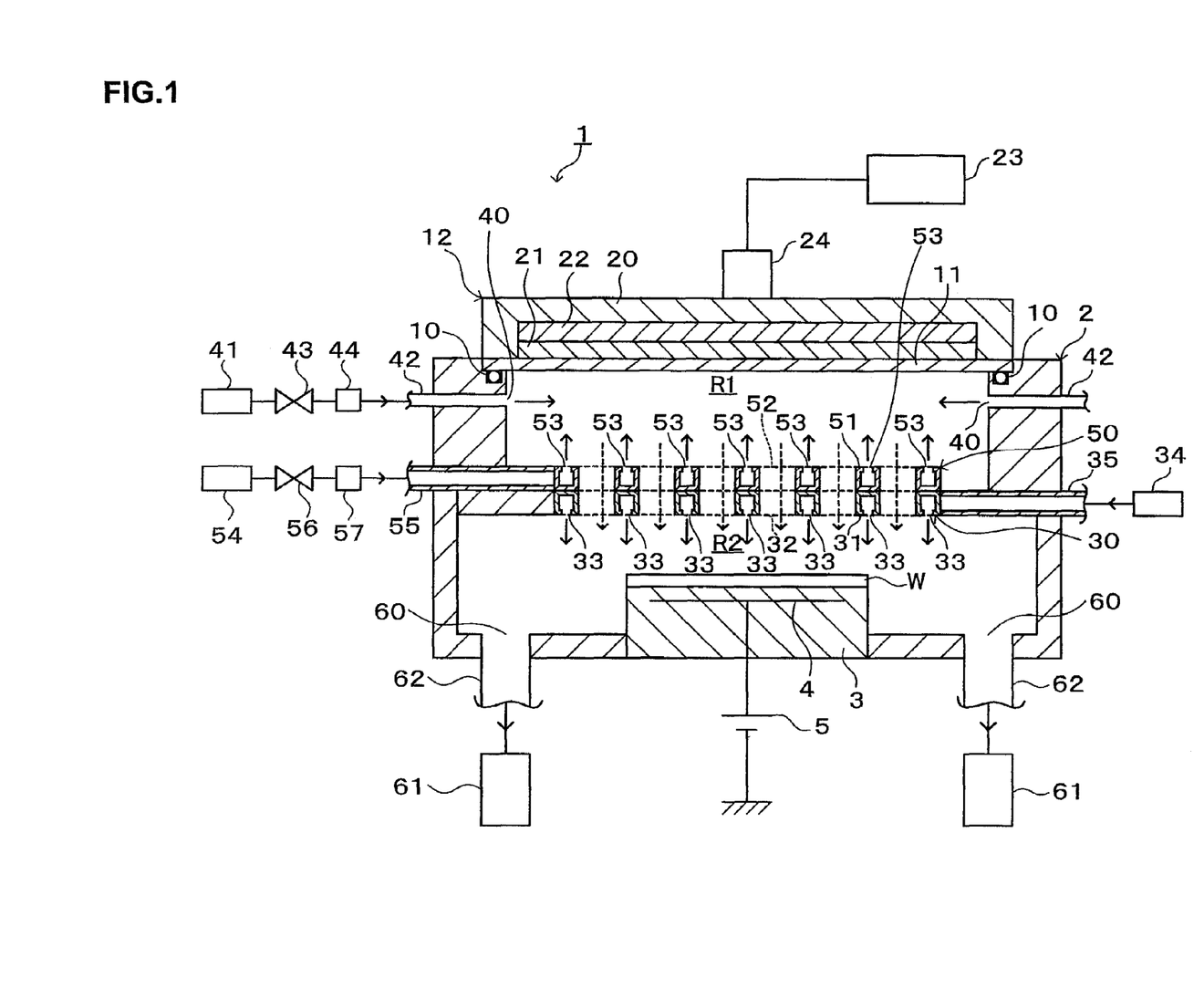
FIG. 1 An explanatory view of a longitudinal section showing the outline of a configuration of a plasma film forming apparatus according to the present embodiment.

Hereinafter, a preferred embodiment of the present invention will be described. FIG. 1 schematically shows the appearance of a longitudinal section of a plasma film forming apparatus 1 according to the embodiment of the present invention. This plasma film forming apparatus 1 is a CVD (chemical vapor deposition) apparatus for generating plasma using a radial line slot antenna.

The plasma film forming apparatus 1 includes a processing container 2, for example, in a bottomed cylindrical shape with a top face open. The processing container 2 is made of, for example, an aluminum alloy. The processing container 2 is grounded. At an almost central portion of the bottom portion of the processing container 2, a mounting table 3 is provided as a mounting unit for mounting, for example, a substrate W thereon.

The mounting table 3 incorporates, for example, a electrode plate 4, and the electrode plate 4 is connected to a direct-current power supply 5 provided outside the processing container 2. The direct-current power supply 5 can be used to generate electrostatic force on the surface of the mounting table 3 to electrostatically attract the substrate W onto the mounting table 3. Note that the electrode plate 4 may be connected to, for example, a not-shown high-frequency power supply for bias.

The processing container 2 is provided with, in its top opening, a dielectric window 11 made of quartz glass or the like with a sealing material 10 intervening therebetween, such as an O-ring for ensuring hermeticity. This dielectric window 11 keeps the processing container 2 closed. On top of the dielectric window 11, a radial line slot antenna 12 is provided as a high frequency wave supply unit for supplying a microwave for plasma generation.

The radial line slot antenna 12 includes an antenna main body 20 in a substantially cylindrical shape with a bottom face open. In the opening portion in the bottom face of the antenna main body 20, a slot plate 21 is provided which is in the shape of a disk formed with a number of slots. On top of the slot plate 21 in the antenna main body 20, a retardation plate 22 is provided which is made of a low-loss dielectric material. To the upper surface of the antenna main body 20, a coaxial waveguide 24 is connected which leads to a microwave oscillator 23. The microwave oscillator 23 is disposed outside the processing container 2 and can oscillate a microwave of a predetermined frequency, for example, 2.45 GHz to the radial line slot antenna 12. With the above configuration, the microwave oscillated from the microwave oscillator 23 is propagated into the radial line slot antenna 12 and compressed by the retardation plate 22 so that the wave has a shorter wavelength, and the wave then generates a circularly polarized wave in the slot plate 21 which is radiated from the dielectric window 11 toward the inside of the processing container 2.

Between the mounting table 3 in the processing container 2 and the radial line slot antenna 12, for example, a source gas supply structure 30 is provided as a structure in the shape of a substantially flat plate. The outline of the source gas supply structure 30 is formed in the shape of a circle having a diameter larger than that of the substrate W in a plan view. The source gas supply structure 30 partitions the inside of the processing container 2 into a plasma generation region R1 on the radial line slot antenna 12 side and a source gas dissociation region R2 on the mounting table 3 side.

Figure 2:
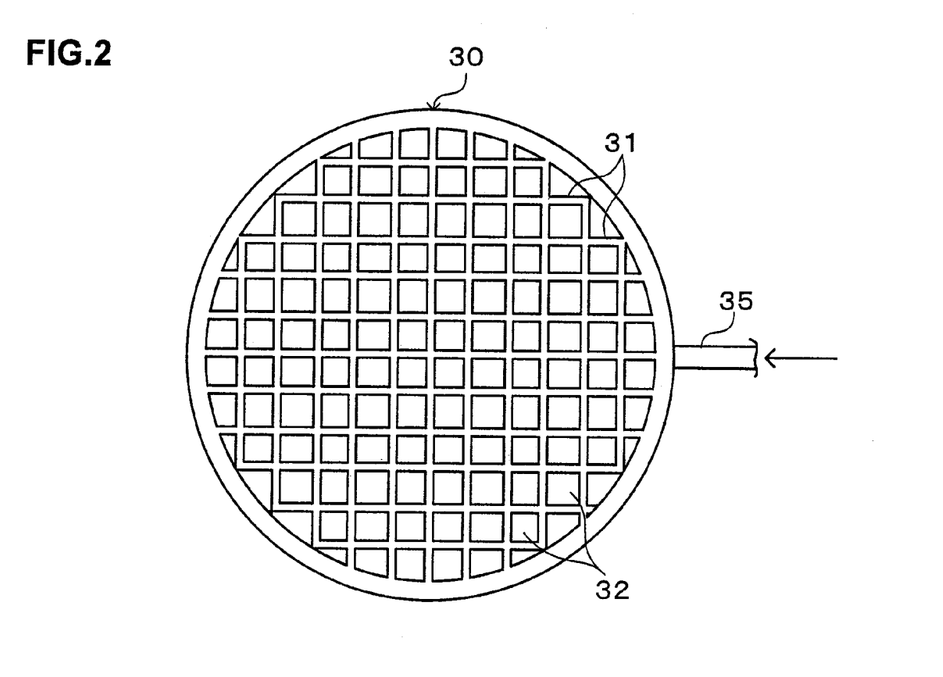
FIG. 2 A plan view of a source gas supply structure.

The source gas supply structure 30 is composed of continuous source gas supply pipes 31 arranged in a substantially lattice form as shown in FIG. 2. The longitudinal section of the source gas supply pipe 31 as viewed in the axial direction is formed in a square. In gaps between the source gas supply pipes 31, a number of opening portions 32 are formed. The plasma generated in the plasma generation region R1 on the upper side of the source gas supply structure 30 can pass through the opening portions 32 to enter the source gas dissociation region R2 on the mounting table 3 side.

The bottom surface of the source gas supply pipes 31 of the source gas supply structure 30 is formed with a number of source gas supply ports 33 as shown in FIG. 1. These source gas supply ports 33 are uniformly arranged within the plane of the source gas supply structure 30. To the source gas supply pipes 31, a gas pipe 35 is connected which communicates with a source gas supply source 34 disposed outside the processing container 2. In the source gas supply source 34, for example, a fluorine-added carbon-based gas as a source gas, for example, $C_5F_8$ gas is sealed. The source gas introduce from the source gas supply source 34 into the source gas supply pipes 31 via the gas pipe 35 is supplied from each of the source gas supply ports 33 toward the source gas dissociation region R2 thereunder.

In the inner peripheral face of the processing container 2 covering the outer peripheral face of the plasma generation region R1, first plasma excitation gas supply ports 40 are formed as other plasma excitation gas supply ports for supplying a plasma excitation gas being a row material of plasma. The first plasma excitation gas supply ports 40 are formed at a plurality of locations, for example, along the inner peripheral face of the processing container 2. To the first plasma excitation gas supply port 40, for example, a first plasma excitation gas supply pipe 42 is connected which penetrates the side wall of the processing container 2 and leads to a first plasma excitation gas supply source 41 disposed outside the processing container 2. Along the first plasma excitation gas supply pipe 42, a valve 43 and a mass-flow controller 44 are provided. The above configuration allows a predetermined flow rate of plasma excitation gas to be supplied from the lateral side into the plasma generation region R1 in the processing container 2. In this embodiment, a rare gas as the plasma excitation gas, for example, argon (Ar) gas is sealed in the first plasma excitation gas supply source 41.

Figure 3:
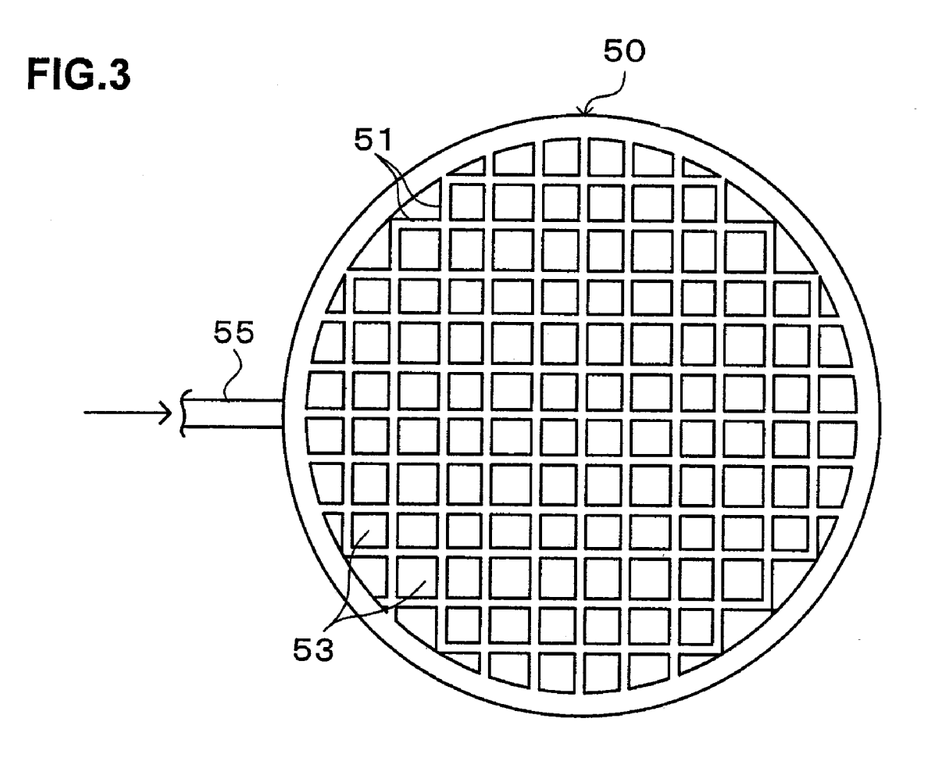
FIG. 3 A plan view of a plasma excitation gas supply structure.

On the upper surface of the source gas supply structure 30, for example, a plasma excitation gas supply structure 50 in the shape of a substantially flat plate is stacked and disposed which has a configuration similar to that of the source gas supply structure 30. The plasma excitation gas supply structure 50 is composed of, for example, second plasma excitation gas supply pipes 51 arranged in a lattice form as shown in FIG. 3. The upper surface of the second plasma excitation gas supply pipes 51 is formed with a plurality of second plasma excitation gas supply ports 53 as shown in FIG. 1. The plurality of second plasma excitation gas supply ports 53 are uniformly arranged within the plane of the plasma excitation gas supply structure 50. This allows the plasma excitation gas to be supplied upward to the plasma generation region R1 from the lower side.

In gaps between the plasma excitation gas supply pipes 51 in a lattice form, opening portions 52 are formed, so that the plasma generated in the plasma generation region R1 can pass through the plasma excitation gas supply structure 50 and the source gas supply structure 30 to enter the source gas dissociation region R2 on the lower side.

To the second plasma excitation gas supply pipes 51, a gas pipe 55 is connected which communicates with a second plasma excitation gas supply source 54 disposed outside the processing container 2. Along the gas pipe 55, a valve 56 and a mass-flow controller 57 are provided, so that a predetermined flow rate of plasma excitation gas can be supplied from the second plasma excitation gas supply ports 53 into the plasma generation region R1. In this embodiment, the same argon gas as that in the first plasma excitation gas supply source 41 is sealed in the second plasma excitation gas supply source 54.

On both sides of the bottom portion of the processing container 2 across the mounting table 3, exhaust ports 60 are provided for exhausting the atmosphere in the processing container 2. To the exhaust ports 60, exhaust pipes 62 are connected which lead to exhausters 61 such as a turbo molecule pump. The exhaust from the exhaust ports 60 allows the inside of the processing container 2 to be maintained at a predetermined pressure.

Next, the operation of the plasma film forming apparatus 1 thus configured will be described. For example, at the time of activating the plasma film forming apparatus 1, the flow rate of the plasma excitation gas supplied from the first plasma excitation gas supply ports 40 and the flow rate of the plasma excitation gas supplied from the second plasma excitation gas supply ports 53 are adjusted so that the concentrations of the plasma excitation gas supplied into the plasma generation region R are uniform. For the flow rate adjustment, the plasma excitation gas set in an appropriate flow rate is supplied from each of the plasma excitation gas supply ports 40 and 53 with, for example, the exhausters 61 being operated to form airflows in the processing container 2 similar to the airflows at the time of actual film forming processing. At that flow rate setting, a film is then actually formed on a test substrate, and whether the film formation has been uniformly performed within the substrate is examined. The film formation is uniformly performed within the substrate when the concentration of the plasma excitation gas in the plasma generation region R1 is uniform, and therefore if it is found from the result of the examination that the film formation has not been uniformly performed within the substrate, the setting of the flow rate of each plasma excitation gas is changed and then film formation is performed for the test substrate again. The forgoing is repeated to set the flow rate from each of the plasma excitation gas supply ports 40 and 53 so that the film formation is uniformly performs within the substrate and the concentration of the plasma excitation gas is uniform in the plasma generation region R1.

After the flow rate from each of the plasma excitation gas supply ports 40 and 53 is set as described above, the film forming processing on the substrate W is started in the plasma film forming apparatus 1. First, the substrate W is carried into the processing container 2 and attracted and held on the mounting table 3. Subsequently, the exhausters 61 start exhausting air from the processing container 2 to reduce the pressure in the processing container 2 to a predetermined pressure, for example, 13.3 Pa (100 mTorr) and keep that state.

After the pressure in the processing container 2 is reduced, argon gas being the plasma excitation gas is supplied into the plasma generation region R1 from the first plasma excitation gas supply ports 40 on the lateral side and the second plasma excitation gas supply ports 53 on the lower side. At this time, the concentration of the plasma excitation gas in the plasma generation region R1 is kept uniform in the plasma generation region R1. From the radial line slot antenna 12, a microwave of, for example, 2.45 GHz is radiated toward the plasma generation region R1 directly below the radial line slot antenna 12. The radiation of the microwave makes the plasma excitation gas plasma in the plasma generation region R1. At this time, plasma is generated in the plasma generation region R1 without unevenness.

The plasma generated in the plasma generation region R1 passes through the plasma excitation gas supply structure 50 and the source gas supply structure 30 to enter the source gas dissociation region R2 on the lower side. Into the source gas dissociation region R2, $C_5F_8$ gas being the source gas is being supplied from each of the source gas supply ports 33 in the source gas supply structure 30. The $C_5F_8$ gas is dissociated by plasma particles entering from the upper side, and dissociated radicals allow a fluorine-added carbon film to deposit and grow on the substrate W.

Thereafter, when the growth of the fluorine-added carbon film progresses so that a fluorine-carbon film with a predetermined thickness is formed on the substrate W, the radiation of microwave and the supply of the source gas and the plasma excitation gas are stopped. The substrate W is then carried out from the processing container 2 and a series of the plasma film forming processing is finished.

According to the above embodiment, the plasma excitation gas can be supplied from the lateral side of the plasma generation region R1 through the first plasma excitation gas supply ports 40, so that the plasma excitation gas never turn into plasma in the plasma excitation gas supply pipe due to the microwave form above, unlike the prior art, thereby making it possible to prevent breakage by the plasma particles in the plasma excitation gas pipe. Further, the plasma excitation gas passing through the first plasma excitation gas supply pipe 42 is appropriately supplied into the plasma generation region R1, so that a sufficient amount of plasma can be generated in the plasma generation region R1. Furthermore, since the plasma excitation gas supply structure 50 is provided on the upper surface of the source gas supply structure 30 to be able to supply the plasma excitation gas to the plasma generation region R1 also from the lower side, the supply flow rates of the plasma excitation gas from the lateral side and from the lower side can be adjusted to control the concentrations of the plasma excitation gas to be uniform in the plasma generation region R1. As a result, plasma can be generated in the plasma generation region R1 without unevenness, and the source gas can be uniformly dissociated also in the source gas dissociation region R2 to form a film on the substrate W which has a uniform thickness within the substrate.

In the plasma excitation gas supply structure 50, the second plasma excitation gas supply pipes 51 are arranged in a lattice form and the upper surface of the second plasma excitation gas supply pipes 51 is provided with the plurality of second plasma excitation gas supply ports 53, so that sufficient plasma excitation gas can be supplied to the plasma generation region R1 from the lower side, thereby making a uniform concentration of the plasma excitation gas in the plasma generation region R1.

Figure 4:
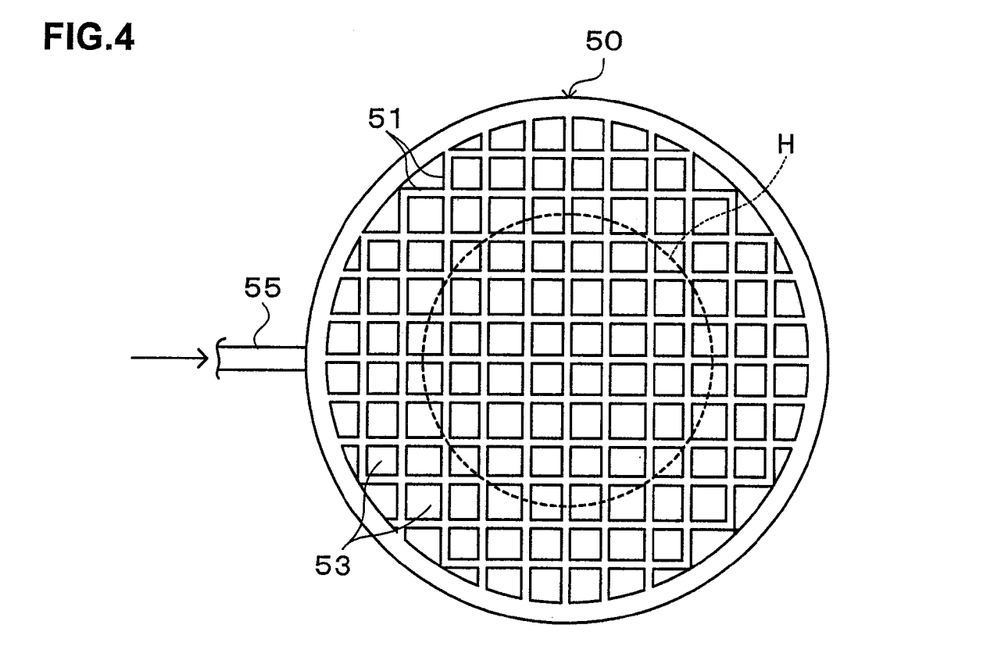
FIG. 4 A plan view of the plasma excitation gas supply structure for explaining positions where second plasma excitation gas supply ports are formed.

While the plurality of second plasma excitation gas supply ports 53 are formed over the entire surface of the plasma excitation gas supply structure 50 in the above embodiment, the second plasma excitation gas supply ports 53 may be formed only at the central portion of the plasma excitation gas supply structure 50. For example, the second plasma excitation gas supply ports 53 may be formed within a central region H of the plasma excitation gas supply structure 50 surrounded by a dotted line in FIG. 4. This central region H is a region, for example, inside the outer peripheral portion of the plasma excitation gas supply structure 50. In this case, since the plasma excitation gas can be intensively supplied to the central portion of the plasma generation region R1 where the gas from the first plasma excitation gas supply ports 40 on the lateral side hardly reaches, the concentration of the plasma excitation gas can be easily made uniform in the plasma generation region R1.

Figure 5:
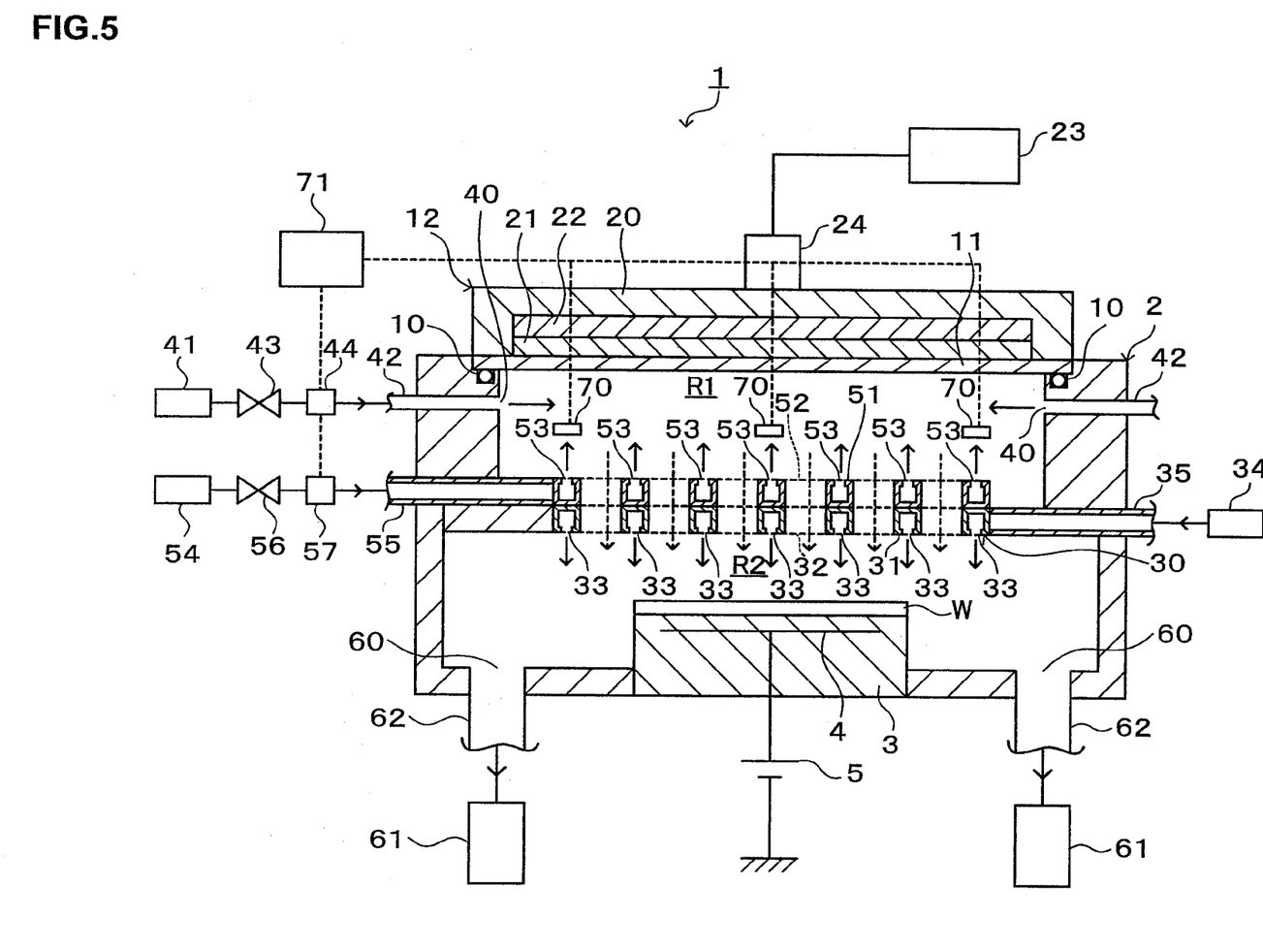
FIG. 5 An explanatory view of a longitudinal section showing the outline of a configuration of a plasma film forming apparatus provided with concentration sensors.

The plasma film forming apparatus 1 described in the above embodiment may further include a sensor for detecting the concentration distribution of the plasma excitation gas in the plasma generation region R1. In this case, for example, a plurality of concentration sensors 70 are provided in the plasma generation region R1 of the processing container 2 as shown in FIG. 5. The concentration sensor 70 can detect the concentration of the plasma excitation gas. The concentration sensors 70 are provided, for example, at least at the central portion and the outer peripheral portions in the plasma generation region R1. The detection results of the concentration sensors 70 are outputted, for example, to a control unit 71 for controlling the mass flow controllers 44 and 57. The control unit 71 can control the mass flow controllers 44 and 57 based on the detection results of the concentration sensors 70 to adjust the supply flow rate of the plasma excitation gas from each of the first plasma excitation gas supply ports 40 and the second plasma excitation gas supply ports 53. When adjusting the supply flow rate from each of the first plasma excitation gas supply ports 40 and the second plasma excitation gas supply ports 53, the distribution of the plasma excitation gas concentrations in the plasma generation region R1 is detected by each of the concentration sensors 70. Then, based on the detection results, the control unit 71 changes each supply flow rate such that the concentrations of the plasma excitation gas in the plasma generation region R1 are uniform. In this case, since the adjustment of the supply flow rates of the plasma excitation gas from the first plasma excitation gas supply ports 40 and from the second plasma excitation gas supply ports 53 is performed using the concentration sensors 70, the adjustment can be performed rapidly and accurately. Note that the flow rate adjustment using the concentration sensors 70 may be performed at the time of flow rate setting which is performed when the plasma film forming apparatus 1 is activated or may be performed during operation of the plasma film forming apparatus 1.

While the plasma excitation gas supply structure 50 is provided in the processing container 2 to supply the plasma excitation gas to the plasma generation region R1 in the above embodiment, the supply of the plasma excitation gas may be performed through use of the source gas supply structure 30.

Figure 6:
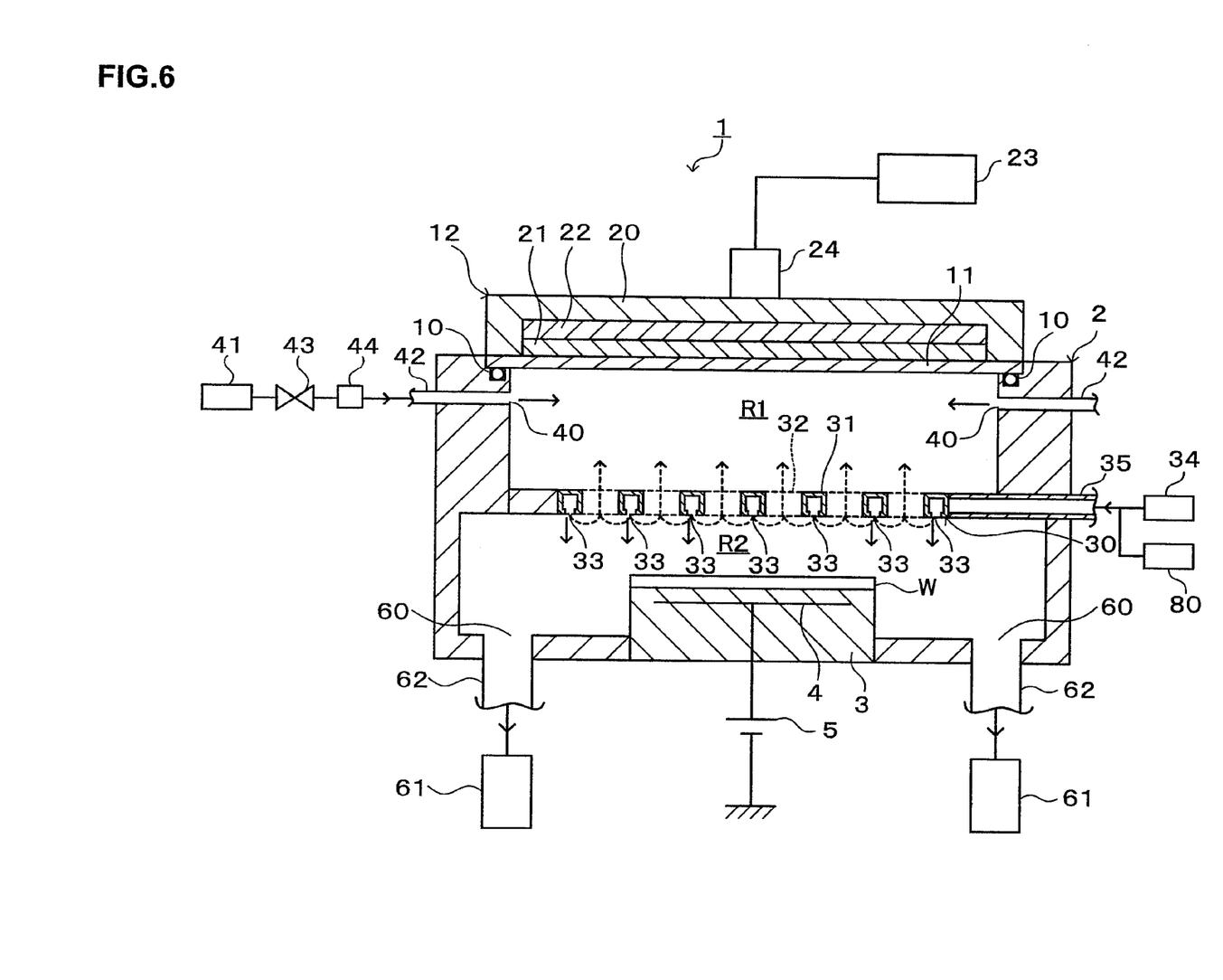
FIG. 6 An explanatory view of a longitudinal section showing the outline of a configuration of a plasma film forming apparatus where a plasma excitation gas supply source communicates with a source gas supply pipe.
Figure 7:
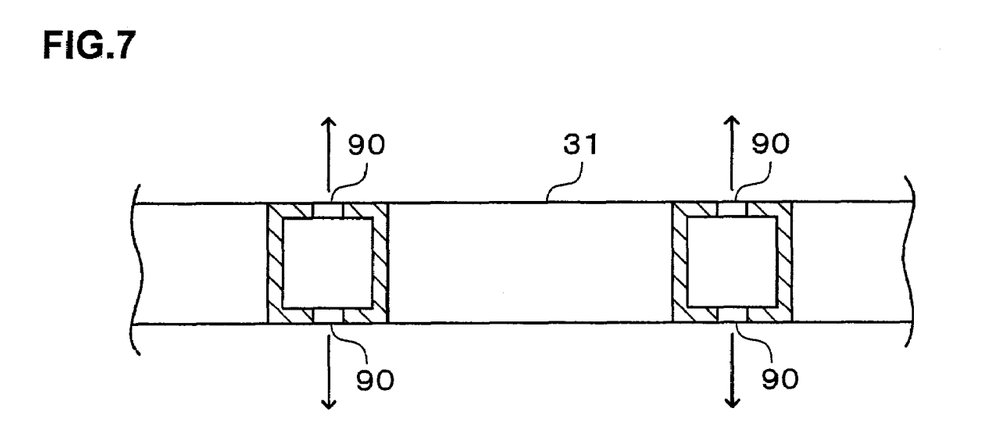
FIG. 7 An explanatory view of a longitudinal section showing a source gas supply pipe with gas supply ports provided in its upper surface and lower surface.

FIG. 6 shows such an example in which, in addition to the source gas supply source 34, a plasma excitation gas supply source 80 is connected to the gas pipe 35 leading to the source gas supply pipes 31 of the source gas supply structure 30. Thereby, the supply systems of the plasma excitation gas and the source gas are constituted of the same system, so that the source gas supply ports 33 also have a function as the second plasma excitation gas supply ports. In this case, since the plasma excitation gas discharged from the source gas supply ports 33 via the source gas supply pipes 31 flows into the plasma generation region R1 from the lower side, the supply flow rate of the plasma excitation gas from each of the source gas supply ports 33 and the first plasma excitation gas supply ports 40 can be adjusted to control the concentrations of the plasma excitation gas to be uniform in the plasma generation region R1. Note that, in this case, gas supply ports 90 may be provided in the upper surface and the lower surface of the source gas supply pipes 31 as shown in FIG. 7.

Figure 8:
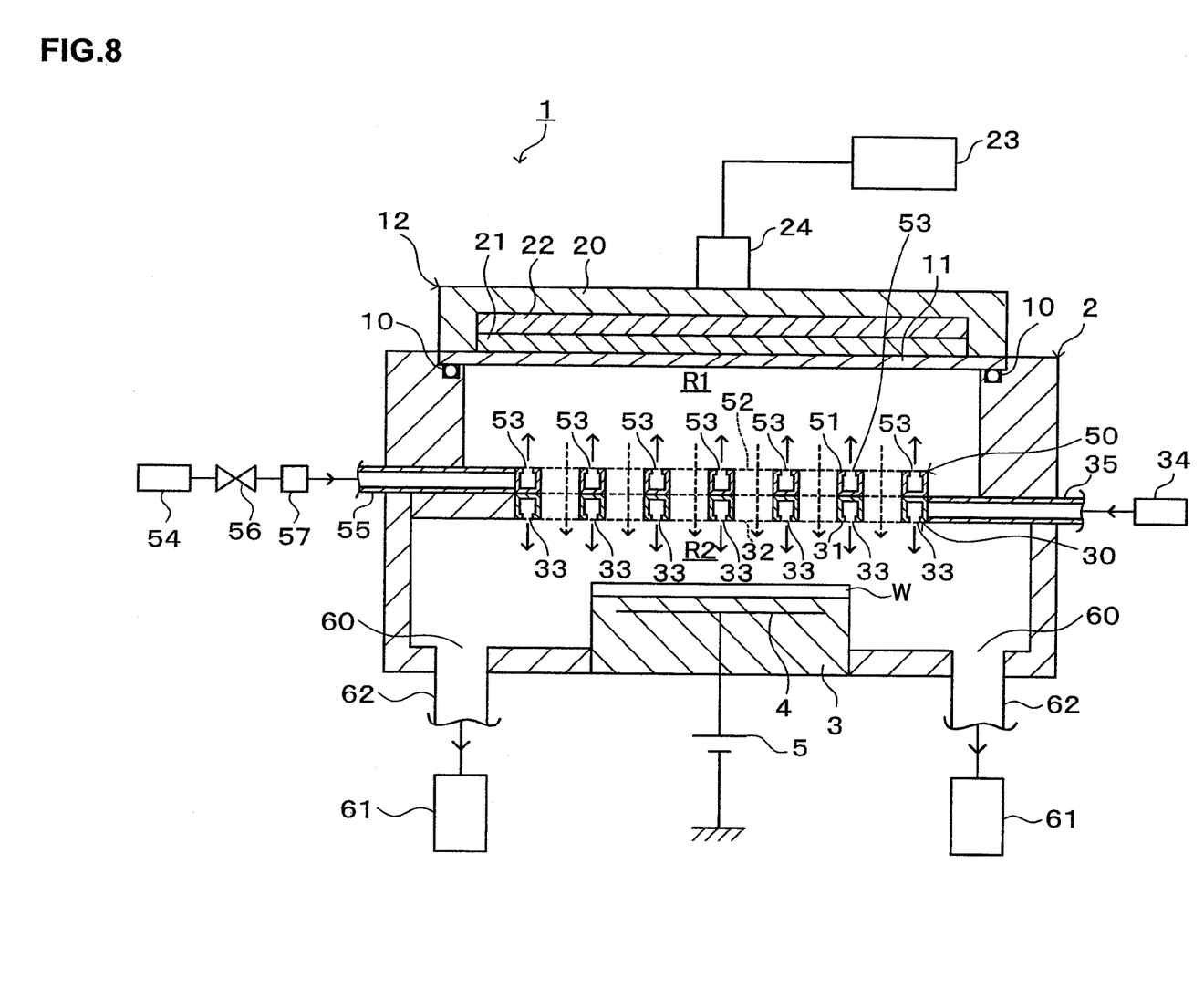
FIG. 8 An explanatory view of a longitudinal section showing the outline of a configuration of a plasma film forming apparatus provided only with second plasma excitation gas supply ports.

Further, while the first plasma excitation gas supply ports 40 for supplying the plasma excitation gas into the plasma generation region R1 from the lateral side and the second plasma excitation gas supply ports 53 for supplying the gas from the lower side are provided in the processing container 2 in the above embodiment, only the second plasma excitation gas supply ports 53 may be provided as shown in FIG. 8. In this case, for example, a plurality of second plasma excitation gas supply ports 53 are formed in the second plasma excitation gas supply pipes 51 constituting the plasma excitation gas supply structure 50 and uniformly arranged within the plasma excitation gas supply structure 50. Also in this case, the plasma excitation gas never turns into plasma before the plasma excitation gas is supplied into the processing container 2, so that plasma is appropriately generated in the plasma generation region R1. Moreover, since the plasma excitation gas is uniformly supplied to the plasma generation region R1, plasma can be generated in the plasma generation region R1 without unevenness. Note that if uneven airflows are formed in the processing container 2 due to the positions of the exhaust ports 60, the arrangement of the plurality of second plasma excitation gas supply ports 53 may be changed so that the plasma excitation gas is uniformly supplied into the plasma generation region R1.

Figure 9:
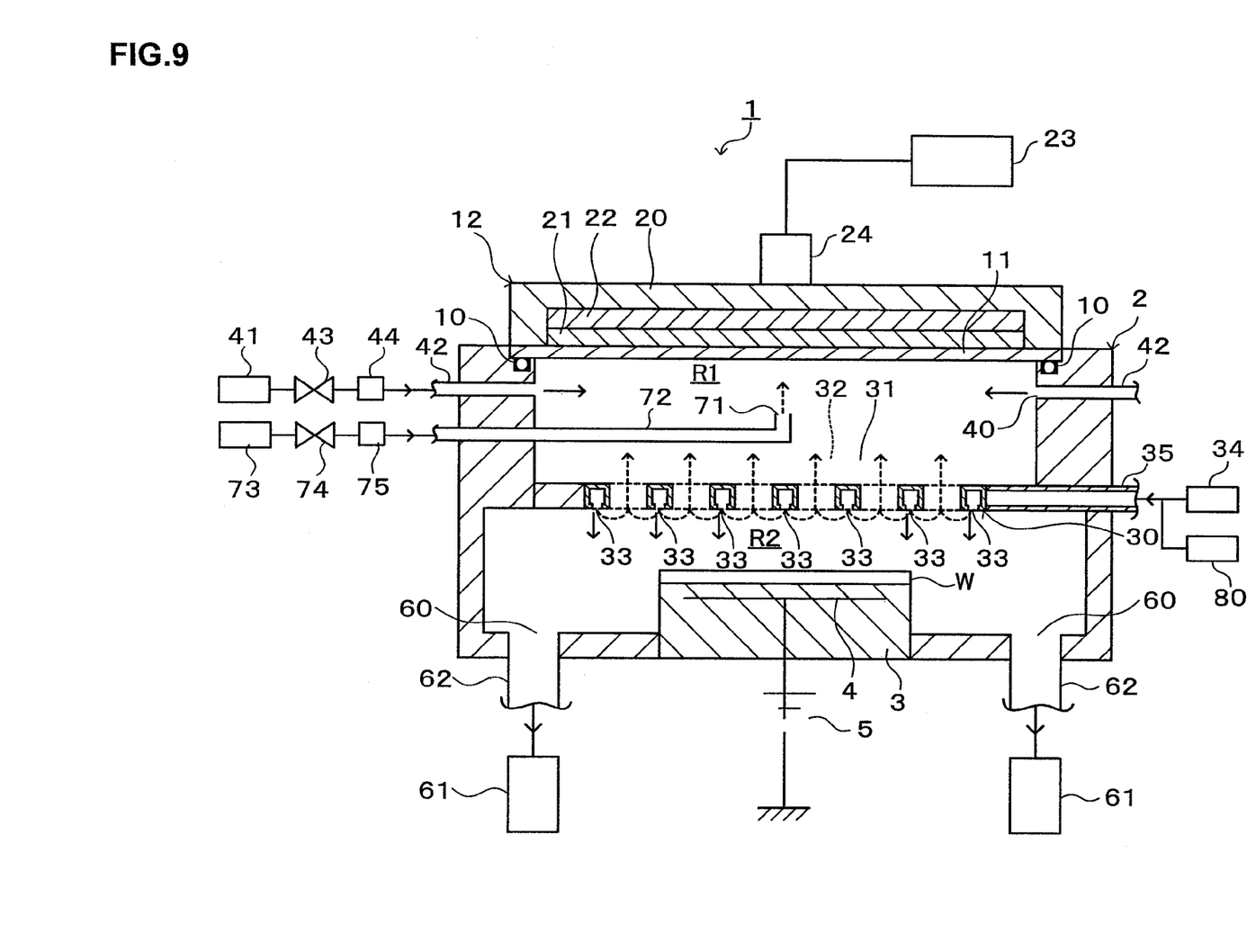
FIG. 9 An explanatory view of a longitudinal section showing the outline of a configuration of a plasma film forming apparatus provided with a plasma excitation gas supply port for supplying a plasma excitation gas directly to a central portion of a plasma generation region.

Furthermore, if the plasma excitation gas is insufficient at the central portion in the plasma generation region R1 and thus may hinder the uniformity of plasma, for example, another excitation gas supply port 71 for supplying the plasma excitation gas toward the center of the plasma generation region R1 from the lower side may be separately located as shown in FIG. 9.

This excitation gas supply port 71 is formed in a nozzle pipe 72 extending to the plasma generation region R1. The nozzle pipe 72 may be composed of a dielectric made of quartz, alumina, ceramic or the like, or stainless steel or aluminum.

To the nozzle pipe 72, a plasma excitation gas supply source 73, a valve 74, and a mass flow controller 75 are connected outside the processing container 2. Note that the plasma excitation gas supply source 73 may be used in common with the plasma excitation gas supply source 41.

Since the excitation gas supply port 71 can be used to supply gas for plasma excitation to the central portion of the plasma generation region R1, adjustment of the plasma density at the central portion can be individually performed, so the uniformity of plasma in the plasma generation region R1 can be improved by performing the density adjustment together with the adjustment of the supply amount from the excitation gas supply ports 42.

Figure 10:
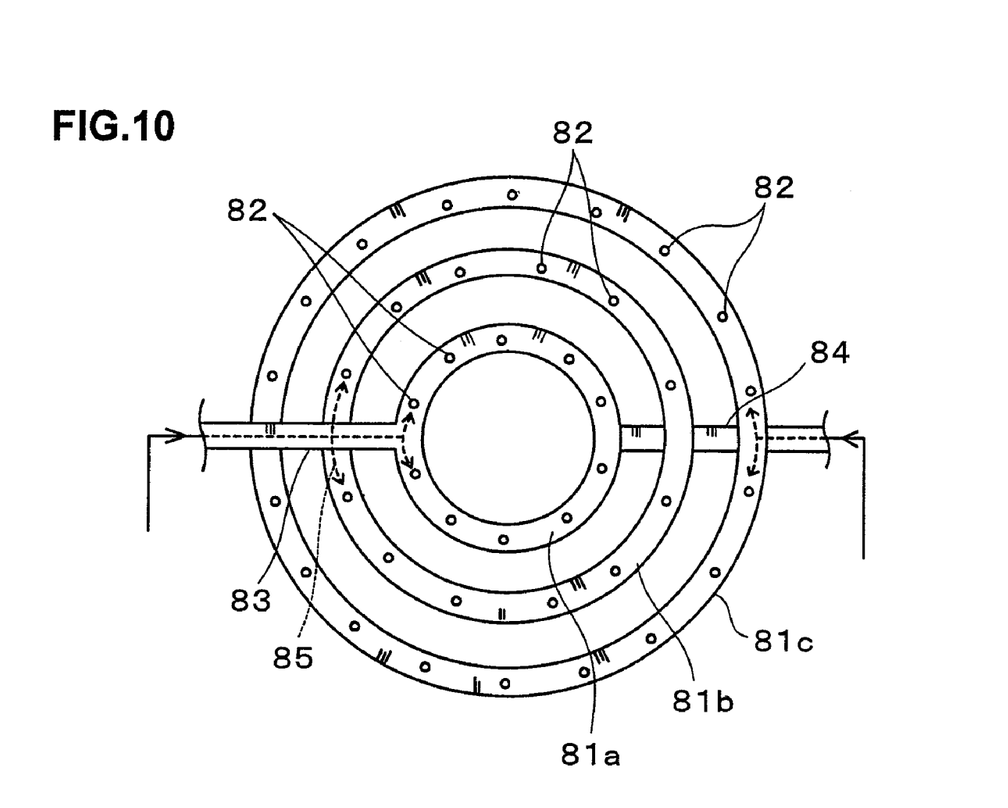
FIG. 10 A plan view of a source gas supply structure in a concentric form.

While the source gas supply structure 30 in a lattice form is employed in the above-described embodiment, the source gas supply structure is not limited to the above form but, for example, a source gas supply structure 81 in a concentric form shown in FIG. 10 may be employed.

The source gas supply structure 81 has three hollow constituent members 81a, 81b, and 81c in an annular form having different diameters, and each of the constituent members 81a, 81b, and 81c is formed with gas supply ports 82 arranged evenly along the form of the constituent member. The three constituent members 81a, 81b, and 81c are integrated by means of connecting members 83 and 84 in a straight form.

The connecting member 83 is for supplying gas to the constituent members 81a and 81b, and the connecting member 84 is for supplying gas to the constituent member 81c, each of the connecting members 83 and 84 is composed of a hollow pipe. The connecting member 83 horizontally penetrates the constituent members 81c and 81b from one side and is connected in communication with the constituent member 81a, and an opening 85 is formed in the through portion 81b. This allows the gas supplied into the connecting member 83 to be uniformly supplied from the gas supply ports 82 in the constituent members 81a and 81b.

The connecting member 84 also horizontally penetrates the constituent members 81c and 81b from the other side to reach the constituent member 81a in a manner to oppose to the connecting member 83, but communicates only with the constituent member 81c. This allows the source gas supplied into the connecting member 84 to be uniformly supplied from the gas supply ports 82 in the constituent member 81c.

The use of the source gas supply structure 81 in a concentric form as described above enables supply of the source gas and the plasma excitation gas into the processing container 2 separately for the constituent members 81a and 81b and for the constituent member 81c and adjustment of the gas flow rate for the partitioned regions in a concentric form.

One example of the embodiment of the present invention has been described in the foregoing, and the present invention is not limited to this example but may take various aspects. For example, while an insulating film of a fluorine-carbon film is formed on the substrate W in the above embodiment, the present invention is also applicable to the case where other kinds of insulating films or other films such as an electrode film are formed.

Furthermore, while the plasma source is microwave plasma using the radial line slot antenna (RLSA) 12 in the above embodiment, the present invention is not limited to such a plasma source but can use, as a matter of course, other plasma sources including ICP (Inductively Coupled Plasma) and ECR (Electron Cyclotron Resonance) plasma.

INDUSTRIAL APPLICABILITY

The present invention is useful in forming a film on a substrate using plasma.

What is claimed is:

1. A plasma film forming apparatus for forming a film on a substrate using plasma, comprising:
    a processing container for processing the substrate accommodated therein;
    a mounting unit for mounting the substrate thereon in said processing container;
    a high frequency wave supply unit for supplying a high frequency wave for plasma generation into said processing container;
    a flat-plate structure provided between said high frequency wave supply unit and said mounting unit and partitioning an inside of said processing container into a region on said high frequency wave supply unit side and a region on said mounting unit side; and
    a plasma excitation gas supply port for supplying a plasma excitation gas at least from a lower side of the region on said high frequency wave supply unit side toward a central portion of the region on said high frequency wave supply unit side,
    wherein said structure is formed with a source gas supply port for supplying a source gas for film formation into the region on said mounting unit side and an opening for allowing plasma generated in the region on said high frequency wave supply unit side to pass to the region on said mounting unit side.

2. The plasma film forming apparatus as set forth in claim 1,
    wherein a plurality of said plasma excitation gas supply ports are formed.

3. The plasma film forming apparatus as set forth in claim 2,
    wherein said plasma excitation gas supply ports are arranged to be able to uniformly supply the plasma excitation gas to the region on said high frequency wave supply unit side.

4. The plasma film forming apparatus as set forth in claim 1, further comprising:
    another plasma excitation gas supply port for supplying the plasma excitation gas from a lateral side to the region on said high frequency wave supply unit side.

5. The plasma film forming apparatus as set forth in claim 4,
    wherein said plasma excitation gas supply port is formed at a central portion of the region on said high frequency wave supply unit side in a plan view.

6. The plasma film forming apparatus as set forth in claim 1,
    wherein said plasma excitation gas supply port is formed upward from the lower side of the region on said high frequency wave supply unit side.

7. The plasma film forming apparatus as set forth in claim 1,
    wherein an upper surface of said structure has a plasma excitation gas supply pipe through which the plasma excitation gas passes arranged along the upper surface of said structure, and wherein said plasma excitation gas supply port is formed in said plasma excitation gas supply pipe.

8. The plasma film forming apparatus as set forth in claim 7, wherein said plasma excitation gas supply pipe is arranged in a lattice form in a plan view on the upper surface of said structure.

9. The plasma film forming apparatus as set forth in claim 1, wherein said structure has a gas supply pipe leading to a supply source of the source gas, arranged in a lattice form in a plan view,
wherein a plurality of said source gas supply ports are formed in said gas supply pipe,
wherein said gas supply pipe also leads to a supply source of the plasma excitation gas, and
wherein said source gas supply port has a function as said plasma excitation gas supply port.

10. The plasma film forming apparatus as set forth in claim 1, further comprising:
a sensor for detecting a concentration distribution of the plasma excitation gas in the region on said high frequency wave supply unit side.

11. A plasma film forming method for forming a film on a substrate using a plasma film forming apparatus comprising a processing container for processing the substrate accommodated therein; a mounting unit for mounting the substrate thereon in the processing container; and a high frequency wave supply unit for supplying a high frequency wave for plasma generation into the processing container, in which a plasma generation region is formed between the mounting unit and the high frequency wave supply unit where plasma is generated from a plasma excitation gas, said method comprising the steps of:
supplying the plasma excitation gas at least from a lateral side and a lower side of the plasma generation region to a central portion of the plasma generation region, and adjusting each of supply flow rates of the plasma excitation gases from the lateral side and the lower side of the plasma generation region to conduct a control so that concentrations of the plasma excitation gas are uniform in the plasma generation region.

12. The plasma film forming apparatus as set forth in claim 1, wherein said opening is formed with high aperture ratio in the structure so as to allow plasma generated in the region on said high frequency wave supply unit side to pass to the region on said mounting unit side.

13. The plasma film forming apparatus as set forth in claim 1, wherein said high frequency wave supply unit is a radial line slot antenna.

* * * * *